US011831102B2

(12) United States Patent
Kelley

(10) Patent No.: US 11,831,102 B2
(45) Date of Patent: Nov. 28, 2023

(54) BACKPLANE INTERCONNECT SYSTEM EMPLOYING FLOATING BACKPLANE INTERCONNECTS FOR COUPLING A BACKPLANE WITH BLADE COMPUTER SYSTEMS

(71) Applicant: Microsoft Technology Licensing, LLC, Redmond, WA (US)

(72) Inventor: Douglas Patrick Kelley, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 373 days.

(21) Appl. No.: 17/166,764

(22) Filed: Feb. 3, 2021

(65) Prior Publication Data
US 2022/0247125 A1 Aug. 4, 2022

(51) Int. Cl.
*H01R 13/631* (2006.01)
*H01R 12/72* (2011.01)
(Continued)

(52) U.S. Cl.
CPC ....... *H01R 13/6315* (2013.01); *H01R 12/721* (2013.01); *H05K 7/1487* (2013.01);
(Continued)

(58) Field of Classification Search
CPC ............ H01R 13/6315; H01R 13/6456; H01R 12/77; H01R 12/79; H01R 12/721; H01R 12/91; H05K 7/1487; H05K 7/1492
(Continued)

(56) References Cited

U.S. PATENT DOCUMENTS 4,894,015 A * 1/1990 Stockero ................ H05K 3/363
29/842
5,113,316 A * 5/1992 Navarro ................. H05K 1/144
174/541
(Continued)

FOREIGN PATENT DOCUMENTS

EP 2268111 A2 12/2010

OTHER PUBLICATIONS

"International Search Report and Written Opinion Issued in PCT Application No. PCT/US22/012847", dated May 9, 2022, 11 Pages.

*Primary Examiner* — Marcus E Harcum
(74) *Attorney, Agent, or Firm* — Withrow & Terranova, PLLC

(57) ABSTRACT

Backplane employing floating backplane network interconnects for electrical coupling with blade computer systems and related methods. To provide a displacement tolerant interconnection system between the backplane interconnects and respective blade backplane interconnects of blade computer systems to establish electrical connections therebetween, the backplane interconnects are provided as floating backplane interconnections. The floating backplane interconnects are configured to move and be displaced relative to the backplane while still retaining an electrical connection to the backplane. The backplane interconnects each include one or more flex circuits connected to electrical interconnects on the backplane on a first end, and electrical interconnects on a backplane connector on a second end. The flex circuit(s) include an electrical cable that includes a polymer or other material surrounding electrical wires to allow the flex circuit and its internal electrical wires to bend and flex, and thus move relative to backplane.

23 Claims, 12 Drawing Sheets

(51) Int. Cl.
*H05K 7/14* (2006.01)
*H01R 12/51* (2011.01)

(52) U.S. Cl.
CPC ......... *H05K 7/1492* (2013.01); *H01R 12/515* (2013.01); *H01R 2201/06* (2013.01)

(58) Field of Classification Search
USPC .............................. 439/67, 77, 439, 495, 496
See application file for complete search history.

(56) References Cited

U.S. PATENT DOCUMENTS

| | | | | |
|---|---|---|---|---|
| 5,123,852 A * | 6/1992 | Gillett | ................. | H01R 12/853 |
| | | | | 439/74 |
| 5,171,154 A * | 12/1992 | Casciotti | ............ | H01R 12/7082 |
| | | | | 439/465 |
| 5,194,010 A * | 3/1993 | Dambach | ................ | H01R 12/57 |
| | | | | 439/67 |
| 5,205,750 A * | 4/1993 | Darrow | ................. | H01R 12/62 |
| | | | | 439/91 |
| 5,228,863 A * | 7/1993 | Campbell | ............... | H01R 31/00 |
| | | | | 439/493 |
| 5,856,908 A * | 1/1999 | Takiguchi | ........... | B60R 16/0215 |
| | | | | 361/627 |
| 6,040,624 A * | 3/2000 | Chambers | .............. | H05K 1/147 |
| | | | | 257/668 |
| 6,077,090 A * | 6/2000 | Campbell | .......... | H01R 12/7082 |
| | | | | 439/67 |
| 6,077,124 A * | 6/2000 | Etters | .................... | H01R 12/79 |
| | | | | 439/496 |
| 6,336,816 B1 * | 1/2002 | Yatskov | ............. | H01R 12/7005 |
| | | | | 439/493 |
| 6,672,878 B2 * | 1/2004 | Dean | ....................... | G06F 1/186 |
| | | | | 439/67 |
| 7,014,472 B2 * | 3/2006 | Fjelstad | ................. | H05K 1/147 |
| | | | | 439/637 |
| 7,789,668 B1 * | 9/2010 | Hamner | ................. | H01R 12/89 |
| | | | | 439/260 |
| 7,789,669 B1 * | 9/2010 | Duesterhoeft | ....... | H01R 12/714 |
| | | | | 439/260 |
| 7,794,233 B1 * | 9/2010 | Millard | ................. | H01R 12/62 |
| | | | | 439/67 |
| 8,100,711 B2 * | 1/2012 | Nguyen | ............. | H01R 13/6456 |
| | | | | 439/378 |
| 8,231,390 B2 * | 7/2012 | Millard | ................. | H05K 3/366 |
| | | | | 439/67 |
| 8,279,613 B2 * | 10/2012 | Millard | ................. | H01R 12/79 |
| | | | | 361/749 |
| 8,430,684 B1 * | 4/2013 | Glatts, III | ........... | H01R 12/777 |
| | | | | 439/493 |
| 8,834,182 B2 * | 9/2014 | Clayton | ................ | H01R 12/78 |
| | | | | 439/67 |
| 9,059,551 B2 * | 6/2015 | Liu | ....................... | H01R 12/00 |
| 10,069,254 B1 * | 9/2018 | Lin | ...................... | H05K 7/1487 |
| 2006/0009051 A1 | 1/2006 | Schuylenbergh et al. | | |
| 2006/0067066 A1 * | 3/2006 | Meier | .................... | G06F 1/189 |
| | | | | 439/493 |
| 2009/0023330 A1 * | 1/2009 | Stoner | .................... | H01R 12/62 |
| | | | | 439/493 |
| 2011/0000741 A1 * | 1/2011 | Berker | .................... | F24F 13/24 |
| | | | | 181/296 |
| 2011/0170827 A1 * | 7/2011 | Hamner | ................. | H01R 12/88 |
| | | | | 439/131 |
| 2012/0114286 A1 * | 5/2012 | Taylor | .................... | H01R 13/637 |
| | | | | 439/190 |
| 2012/0115345 A1 * | 5/2012 | Mulfinger | ........... | H05K 7/1457 |
| | | | | 439/296 |
| 2014/0104775 A1 * | 4/2014 | Clayton | ................ | G06F 1/184 |
| | | | | 361/749 |
| 2014/0362546 A1 * | 12/2014 | Sechrist | ............... | H05K 7/1454 |
| | | | | 361/752 |

* cited by examiner

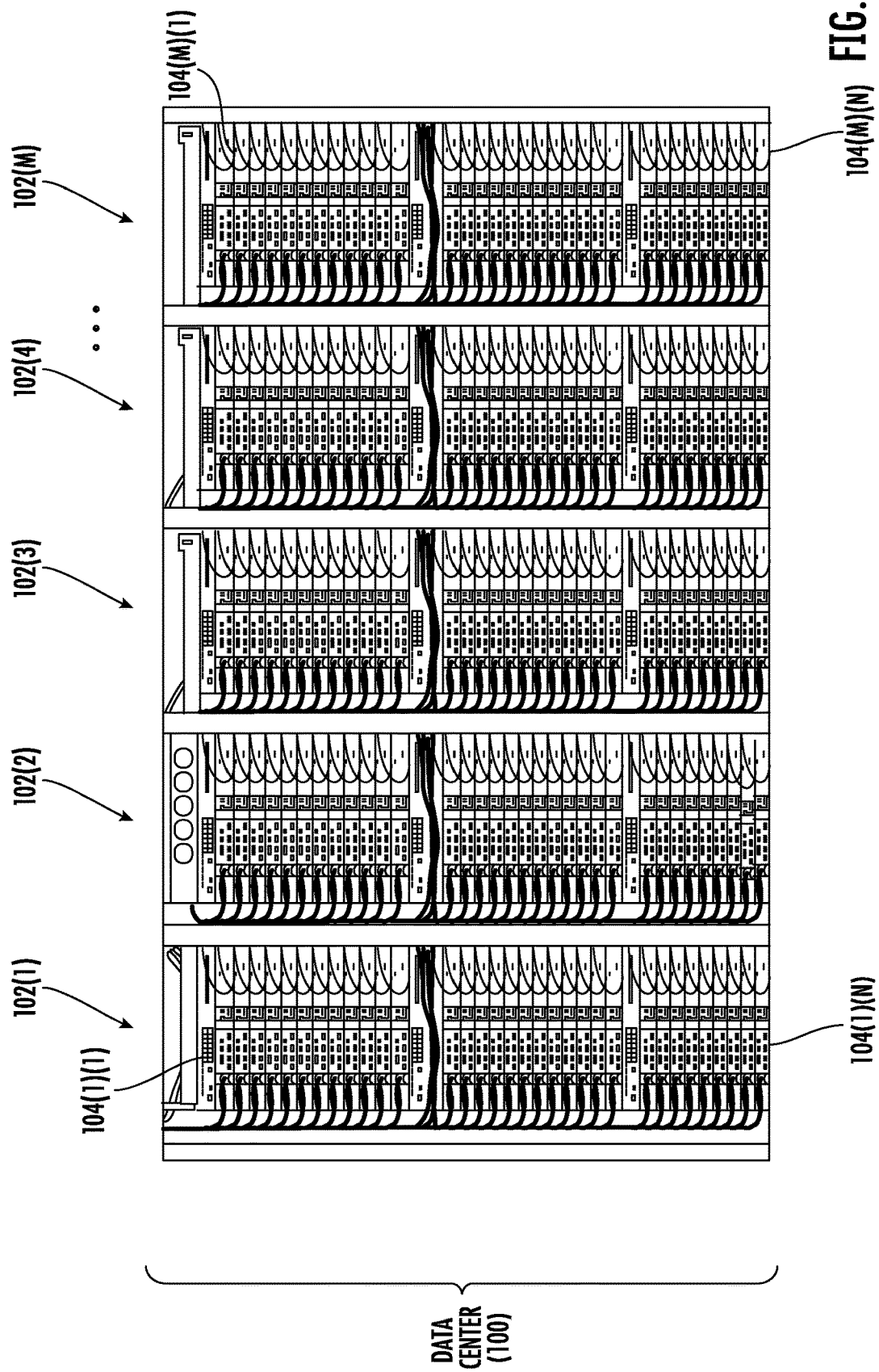

BACKPLANE INTERCONNECT SYSTEM EMPLOYING FLOATING BACKPLANE INTERCONNECTS FOR COUPLING A BACKPLANE WITH BLADE COMPUTER SYSTEMS

FIELD OF THE DISCLOSURE

The technology of the disclosure relates to a blade computer system housed in a chassis and configured to be installed in an equipment rack and interfaced with a backplane network to provide connectivity between the computer system and a computer network.

BACKGROUND

Data centers are integral parts of enterprise systems to support computer business applications and to provide computer-related services. Data centers can provide cloud-based computer services including data storage, data management, software application hosting. Data centers can also be utilized to perform big data applications such as supercomputing applications, machine learning, and artificial intelligence applications for example. Data centers include storage systems, computer servers, and related network infrastructure to facilitate communications with computer servers.

For example, FIG. 1A illustrates a data center 100 which includes 'M' number of computer equipment rack 102(1)-102(M). Each computer equipment rack 102(1)-102(M) is configured to house 'N' number of blade computers 104(1)(1)-104(M)(N). Each blade computer 104(1)(1)-104(M)(N) is provided in the form of one or more printed circuit boards (PCBs), also sometimes referred to as a "card" or "blade." FIG. 1B illustrates a computer equipment rack 102 in the data center 100 in FIG. 1A. As shown in FIG. 1B, the blade computers 104 each include one or more PCBs 106(1), 106(2) that form a blade or card which are supported in respective chassis 108, which may be in the form of an equipment tray. One or more integrated circuit (IC) chips and/or other electrical components are mounted to the PCBs 106(1), 106(2). For example, an IC chip mounted to a PCB 106(1), 106(2) of a blade computer 104 may be a central processing unit (CPU) chip that includes a single processor core ("core") CPU or a multi-core CPU. For example, the blade computer 104 can be configured as a computer server, or as a dedicated processor-based system to perform specific applications and tasks depending on the application.

The chassis 108 of the blade computer 104 is configured to be installed in a respective chassis slot 110(1)-110(N) of a computer equipment rack 102. As shown in FIG. 1B, when the chassis 108 of the blade computer 104 is fully inserted into a chassis slot 110(1) as an example, an edge backplane connector(s) 112 of the blade computer 104 engages with a complementary backplane connector(s) 114 on a backplane 116. This establishes a networked connection between the blade computer 104 and the backplane 116 through an electrical interconnection between the backplane connector(s) 114 of the backplane 116 and the edge backplane connector(s) 112 of a respective blade computer 104. Thus, the computer equipment rack 102 must be designed so that the backplane connector(s) 112 of a blade computer 104 installed into a respective chassis slot 110(1)-110(N) is aligned with the complementary backplane connector(s) 114 on the backplane 116 so that the edge backplane connector(s) 112 and complementary backplane connector(s) 114 can properly engage with each other to form a connection. However, the coefficient of thermal expansion (CTE) of the backplane 116 may be different than the CTE of a PCB 106(2) of the blade computer 104 that supports the edge backplane connector(s) 112 of a respective blade computer 104. This can cause relative vertical displacement strain between the backplane connector(s) 112 of a blade computer 104 and the complementary backplane connector(s) 114 on the backplane 116. This stain may be particularly prevalent in the Z-axis direction of the backplane 116 relative to the blade computer 104 as an example. For example, the blade computer 104 may be employed in a cryogenic super computing environment where the temperatures between different areas of the blade computer 104 and its edge backplane connector(s) 112, and the backplane connector(s) 114 of the backplane 116 can greatly vary thus causing greater relative variance in expansion and contraction between backplane 116, the blade computer 104, and its connectors. This can jeopardize the integrity of the electrical connection between the backplane 116 and a blade computer 104, particularly in high density backplanes where a high density of interconnections are provided in backplane connector(s) 114 with a very low tolerance for displacement with a respective mating edge backplane connector 112.

SUMMARY

Exemplary aspects disclosed herein include a backplane interconnect system employing floating backplane interconnects for coupling a backplane with blade computer systems. The backplane interconnect system includes a backplane interconnected to a plurality of electrical backplane interconnects ("backplane interconnects") configured to be interconnected to a respective, complementary blade computer system interconnect to establish a network interconnection between the backplane and the blade computer system. The blade computer systems are provided in the form of one or more circuit boards (e.g., printed circuit boards (PCBs)) that are supported in a chassis and configured to be installed in a chassis slot in an equipment rack. Each backplane interconnect is configured to be electrically connected with an aligned, respective blade backplane interconnect of a blade computer system installed in a chassis slot to establish an electrical connection between the blade computer system and the backplane. However, the backplane may experience displacement due to thermal expansion and compression due to variances in temperature. This can cause the backplane interconnects on the backplane to be misaligned with chassis slots of an equipment rack, and thus be misaligned with blade backplane interconnects of blade computer systems installed therein. For example, if the backplane is employed in a superconducting computer system, the temperature at the backplane and/or its connected blade computer systems and interconnects may vary greatly, and/or may also vary relative to other supporting components, such as an equipment rack and its chassis slots. This can affect the ability for the backplane interconnect to be properly aligned with blade backplane interconnect of a blade computer system to establish an electrical connection. The connection tolerance between the backplane interconnect and the blade backplane interconnect of a blade computer system may be extremely small for high density interconnects.

In this regard, in exemplary aspects disclosed herein, to provide a displacement tolerant interconnection system between the backplane interconnects of a backplane and respective blade backplane interconnects of blade computer systems to establish electrical connections therebetween, the backplane interconnects of the backplane are provided as floating backplane interconnects. The floating backplane interconnects are configured to flexibly move and be displaced relative to the backplane while still retaining an electrical connection to the backplane. In this regard, in exemplary aspects, the floating backplane interconnects each include one or more flex circuits connected to electrical interconnects on the backplane on a first end, and electrical interconnects on a backplane connector on a second end. The flex circuit(s) include an electrical cable, such as a ribbon cable, that includes a polymer or other material surrounding electrical wires to allow the flex circuit and its internal supported electrical wires to bend and flex, and thus move relative to backplane. Thus, when a blade computer system is installed in a chassis slot, and a blade backplane interconnect is connected to the backplane interconnect in a rigid connection, the backplane interconnect connected to the backplane through the flex circuit(s) can move relative to displacement in the backplane. The electrical connection integrity between the backplane interconnect and a connected blade backplane interconnect of a blade computer system is maintained and not as susceptible to breakage and failure due to displacement of the backplane. In other aspects, the backplane interconnect and the blade backplane interconnect of a blade computer system include registration feature. These registration features are configured to engage with each other to assist in their alignment and electrical connection when a blade computer system is installed in a chassis slot of an equipment rack and moved towards the backplane to engage its blade backplane interconnect to the backplane interconnect of the backplane aligned with the chassis slot. The blade backplane interconnect could also be provided a floating interconnect to allow the blade backplane interconnect to float relative to the circuit board(s) in the blade computer system.

In this regard, in one exemplary aspect, a floating backplane interconnect configured to be coupled to a backplane is provided. The floating backplane interconnect comprises a backplane backer comprising a planar surface. The floating backplane interconnect also comprises a backplane connector disposed on the planar surface, the backplane connector comprising a plurality of backplane connector electrical conductors. The floating backplane interconnect also comprises a flex circuit comprising a flexible electrical cable having a first end and a second end and comprising a plurality of electrical wires extending between the first end to the second end. The electrical wires adjacent to the first end of the flexible electrical cable are each configured to be placed in electrical contact with a respective backplane connector electrical conductor among the plurality of backplane connector electrical conductors, and the electrical wires are adjacent to the second end of the flexible electrical cable.

In another exemplary aspect, a computer system is provided. The computer system comprises a backplane comprising a plurality of backplane electrical conductor arrays aligned adjacent to each other, each of the plurality of backplane electrical conductor arrays comprising a plurality of backplane electrical conductors. The plurality of floating backplane interconnects each comprises a backplane backer comprising a planar surface, a backplane connector disposed on the planar surface, the backplane connector comprising a plurality of backplane connector electrical conductors, and a flex circuit comprising a flexible electrical cable having a first end and a second end and comprising a plurality of electrical wires extending between the first end to the second end. The electrical wires adjacent to the first end of the flexible electrical cable are each in electrical contact with a respective backplane connector electrical conductor among the plurality of backplane connector electrical conductors in a backplane electrical conductor array of the backplane. The electrical wires are adjacent to the second end of the flexible electrical cable are in electrical contact with a respective blade backplane connector electrical conductor among a plurality of blade backplane connector electrical conductors for a respective blade computer system among a plurality of blade computer systems.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1A is diagram of an exemplary data center that includes computer equipment racks with installed blade computer systems;

Figure 3:
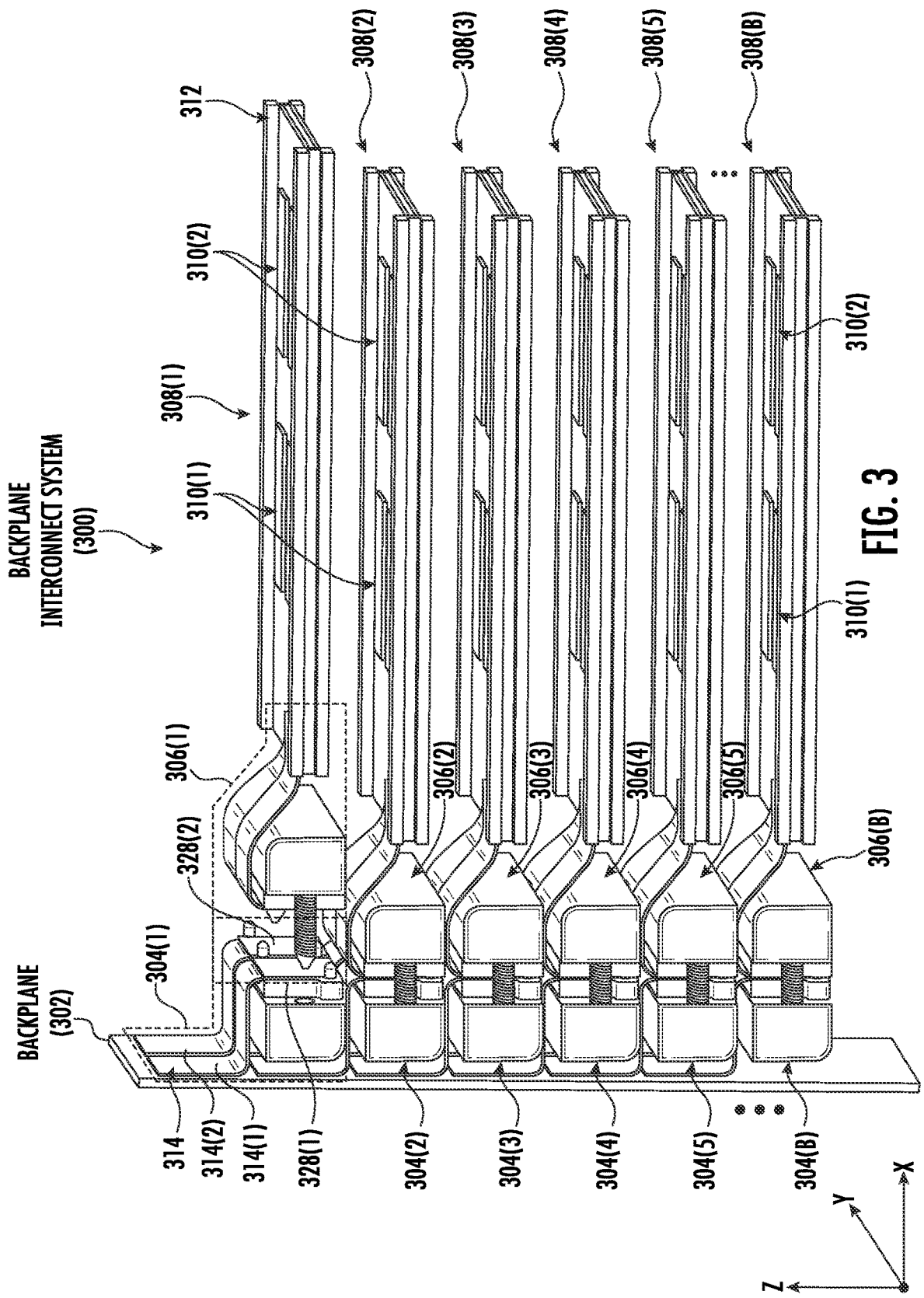
Figure 4:
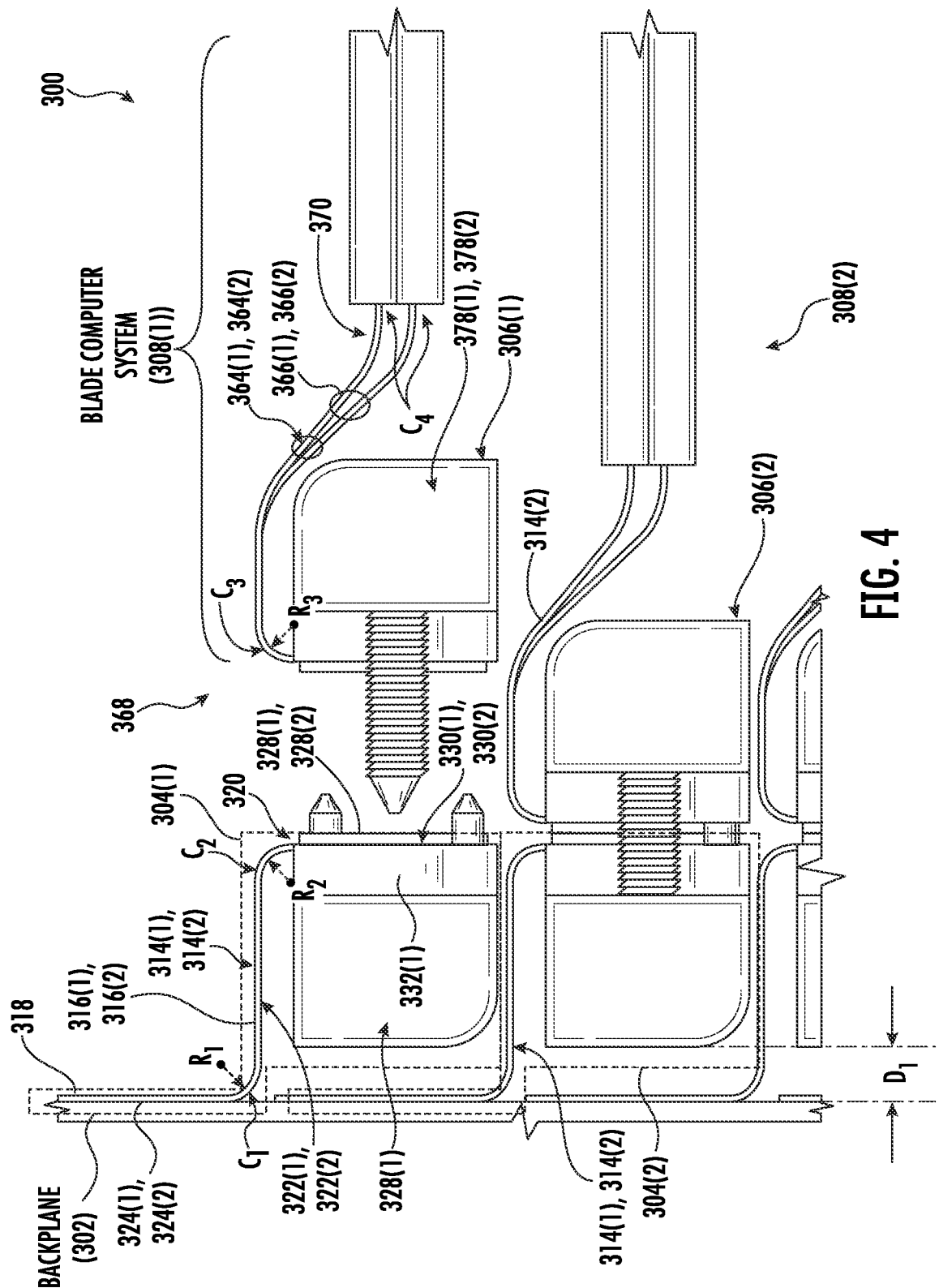
Figure 5A:
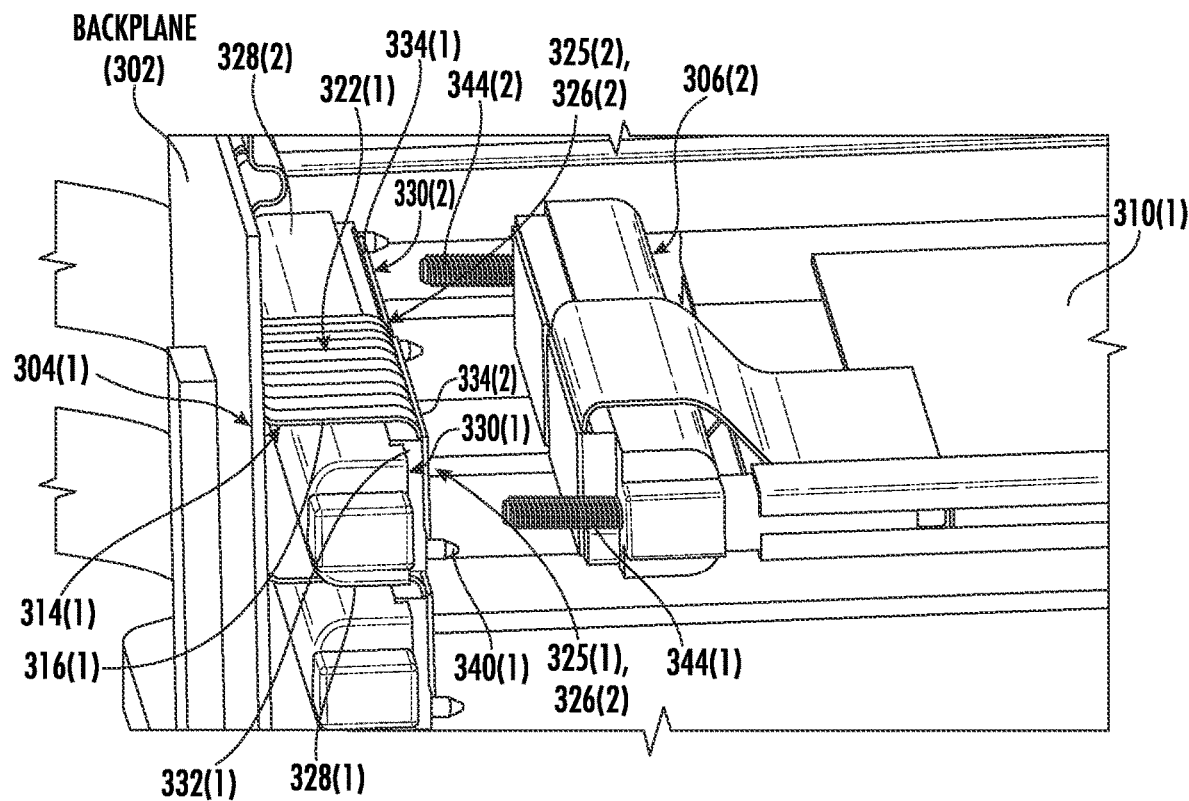
Figure 5B:
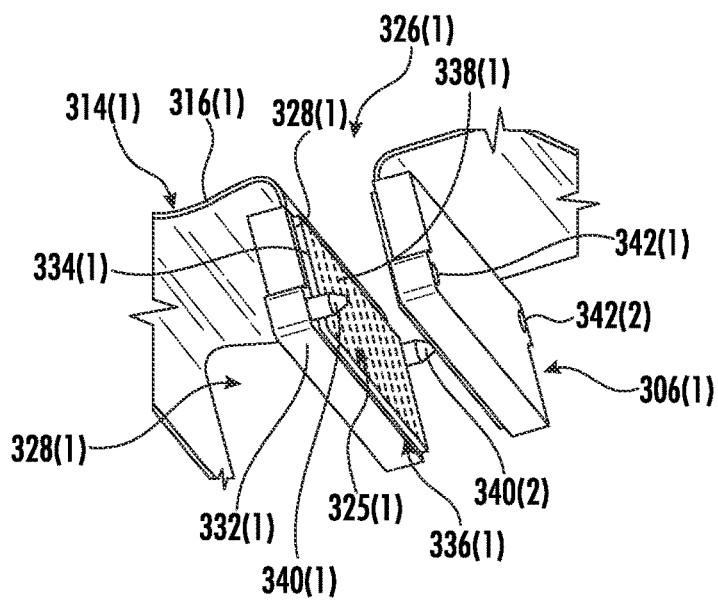
Figure 5C:
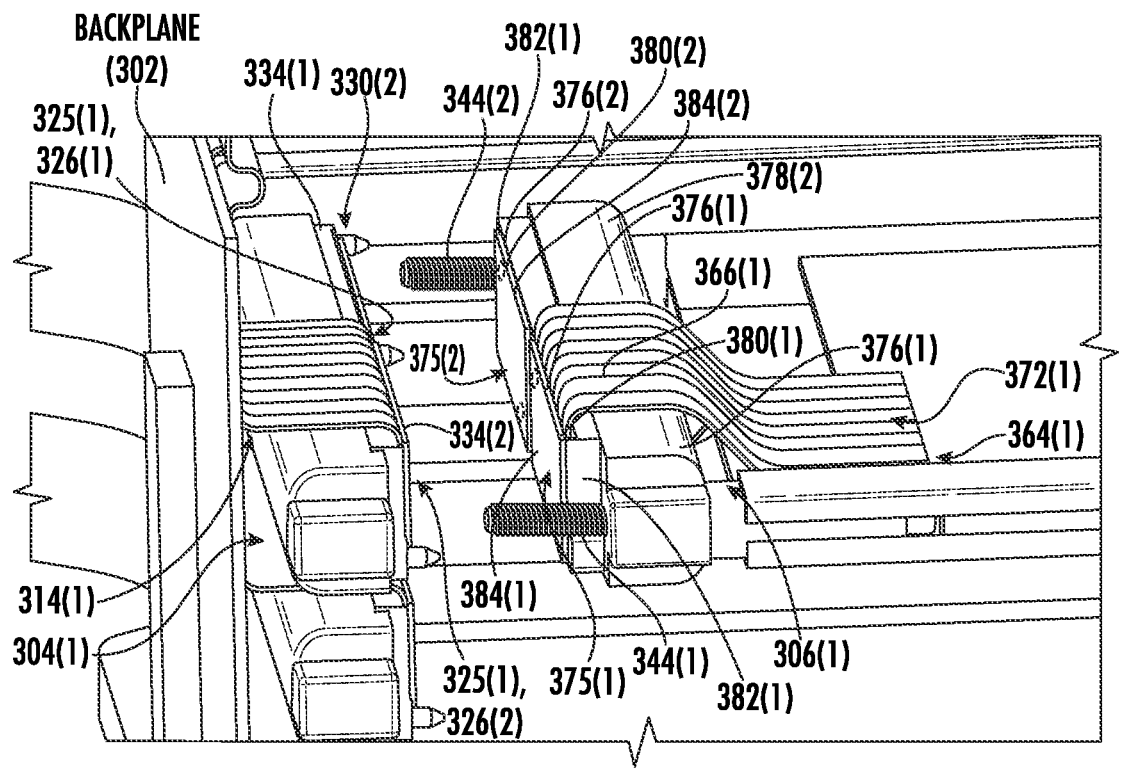
Figure 5D:
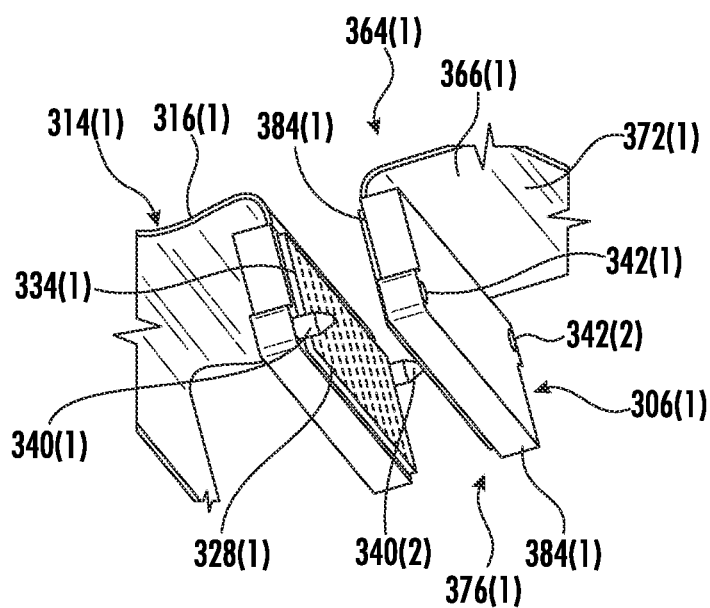
Figure 6:
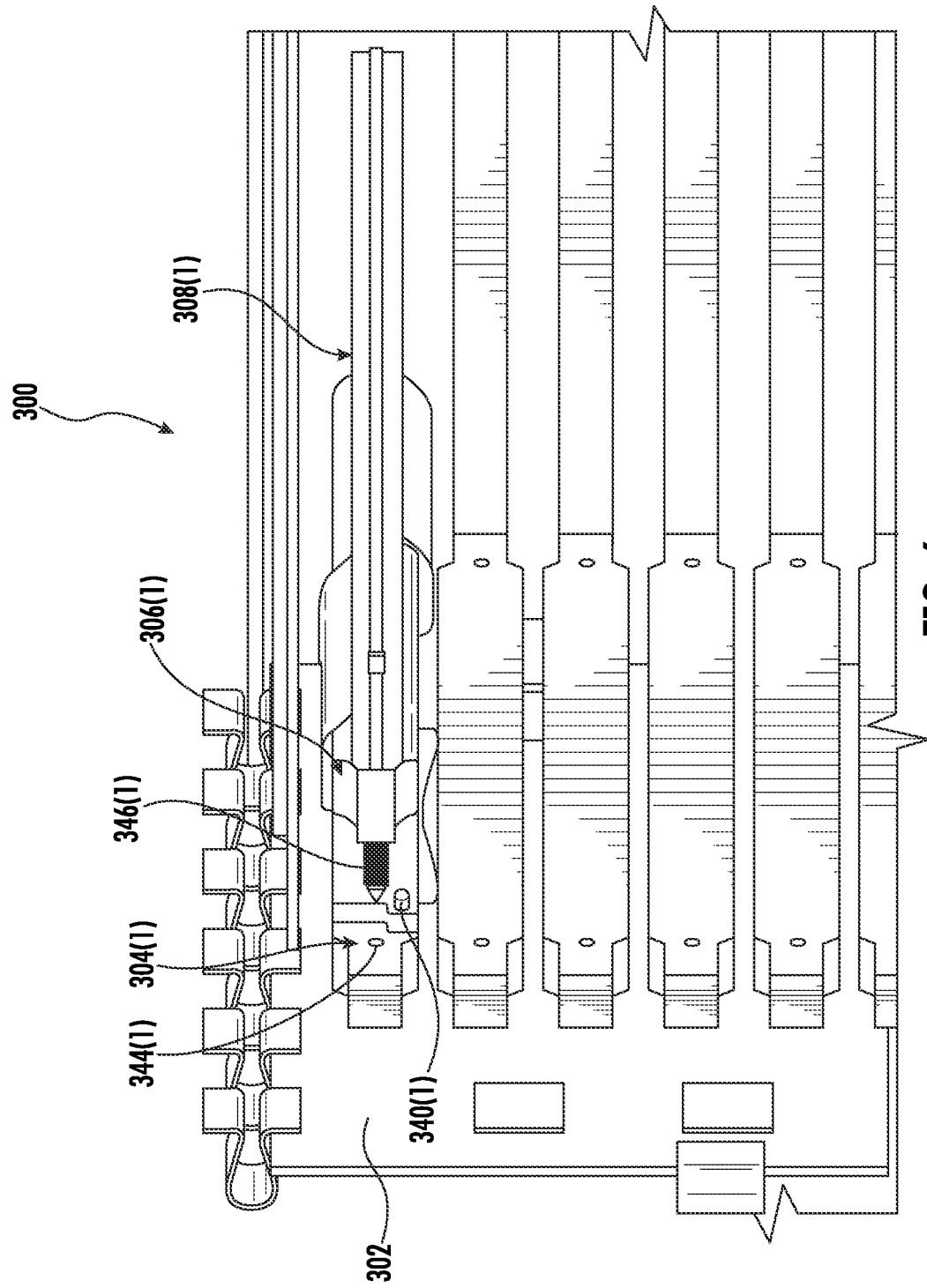
Figure 7:
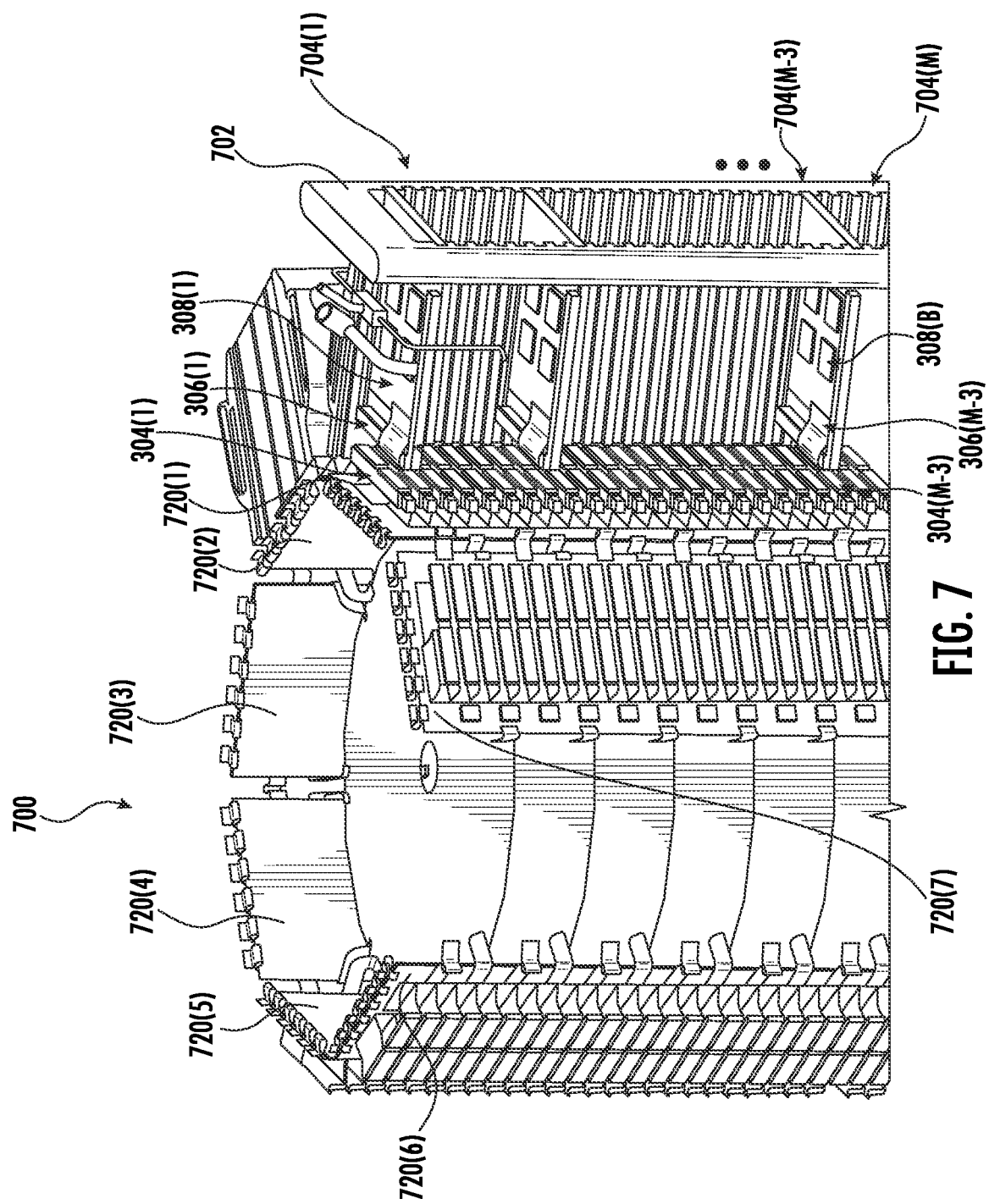
Figure 8:
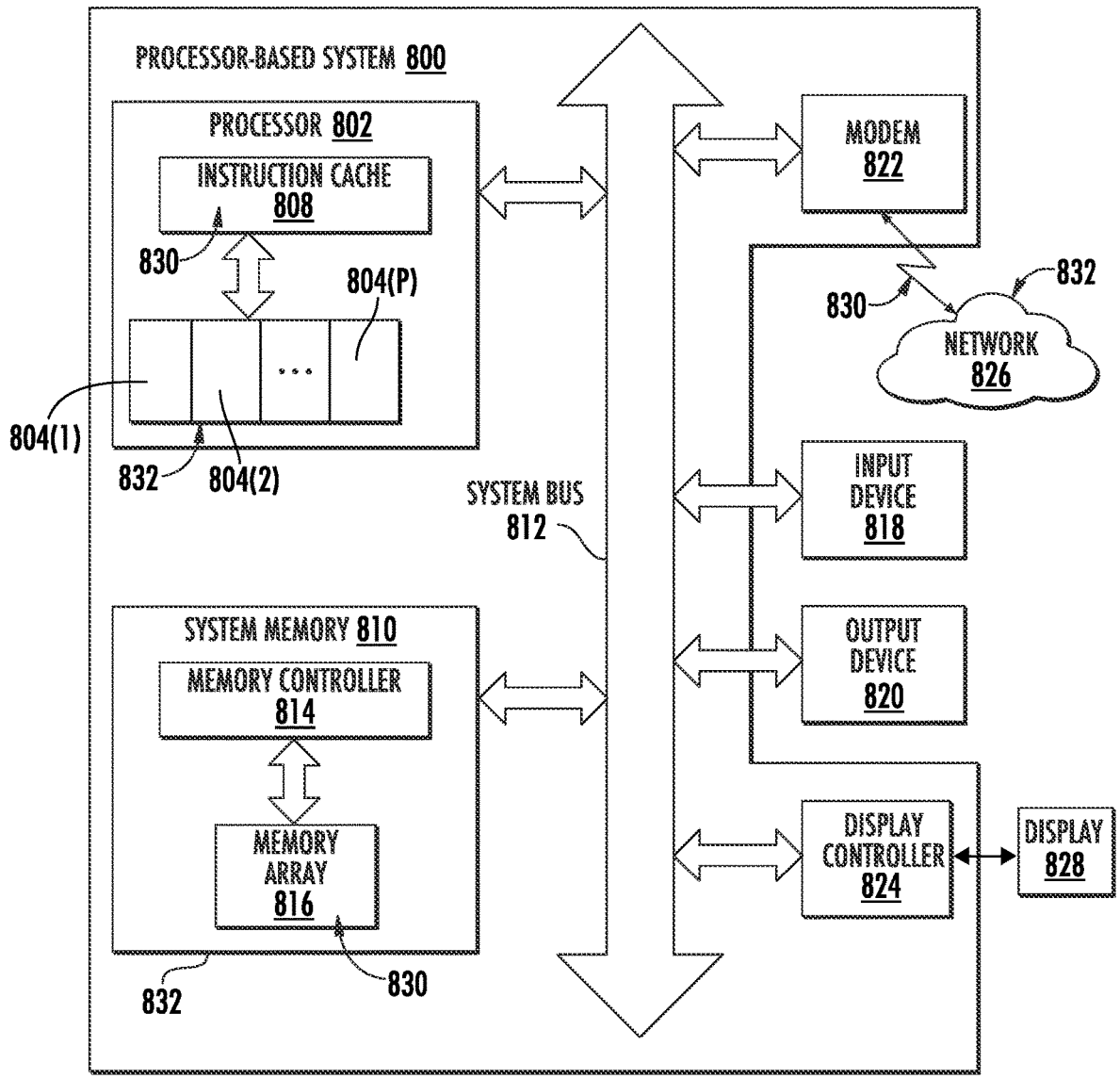

FIG. 3 is a perspective, side view of an exemplary backplane interconnect system that includes a backplane that includes a plurality of floating backplane interconnects configured to float relative to displacement of the backplane, and wherein the floating backplane interconnects are each configured to be interconnected to a respective blade backplane interconnect of a blade computer system to establish an interconnection between the blade computer system and the backplane;

FIG. 4 is a side view of the floating backplane interconnects of the backplane in FIG. 3 aligned with respective blade backplane interconnects of blade computer systems for establishing an interconnection between the blade computer system and the backplane;

FIGS. 5A and 5C are other perspective, side views of the backplane interconnect system in FIGS. 3 and 4;

FIGS. 5B and 5D are close-up, perspective views of a backplane connector of the floating backplane interconnect aligned with a blade backplane connector of a blade backplane interconnect to establish an interconnection between the blade computer system and the backplane;

FIG. 6 is an additional side view of the floating backplane interconnects of the backplane in FIGS. 3 and 4 aligned with respective blade backplane interconnects of blade computer systems to establish an interconnection between the blade computer system and the backplane;

FIG. 7 is a perspective view of a computer system that includes a plurality of backplanes and illustrates an equipment rack installed for one of the backplanes, wherein the equipment rack includes a plurality of chassis slots each configured to support a blade computer system, like shown in FIGS. 3-6, to be interconnected to the backplane through an interconnection between the blade backplane interconnect and a floating backplane interconnect; and FIG. 8 is a block diagram of an exemplary processor-based system that includes a processing unit with one or more processor cores each configured to execute computer instructions for execution, wherein the processor-based system can be provided in a blade computer system, such as the blade computer systems in FIGS. 3-7.

DETAILED DESCRIPTION

Exemplary aspects disclosed herein include a backplane interconnect system employing floating backplane interconnects for coupling a backplane with blade computer systems. The backplane interconnect system includes a backplane interconnected to a plurality of electrical backplane interconnects ("backplane interconnects") configured to be interconnected to a respective, complementary blade computer system interconnect to establish a network interconnection between the backplane and the blade computer system. The blade computer systems are provided in the form of one or more circuit boards (e.g., printed circuit boards (PCBs)) that are supported in a chassis and configured to be installed in a chassis slot in an equipment rack. Each backplane interconnect is configured to be electrically connected with an aligned, respective blade backplane interconnect of a blade computer system installed in a chassis slot to establish an electrical connection between the blade computer system and the backplane. However, the backplane may experience displacement due to thermal expansion and compression due to variances in temperature. This can cause the backplane interconnects on the backplane to be misaligned with chassis slots of an equipment rack, and thus be misaligned with blade backplane interconnects of blade computer systems installed therein. For example, if the backplane is employed in a superconducting computer system, the temperature at the backplane and/or its connected blade computer systems and interconnects may vary greatly, and/or may also vary relative to other supporting components, such as an equipment rack and its chassis slots. This can affect the ability for the backplane interconnect to be properly aligned with blade backplane interconnect of a blade computer system to establish an electrical connection. The connection tolerance between the backplane interconnect and the blade backplane interconnect of a blade computer system may be extremely small for high density interconnects.

In this regard, in exemplary aspects disclosed herein, to provide a displacement tolerant interconnection system between the backplane interconnects of a backplane and respective blade backplane interconnects of blade computer systems to establish electrical connections therebetween, the backplane interconnects of the backplane are provided as floating backplane interconnects. The floating backplane interconnects are configured to flexibly move and be displaced relative to the backplane while still retaining an electrical connection to the backplane. In this regard, in exemplary aspects, the floating backplane interconnects each include one or more flex circuits connected to electrical interconnects on the backplane on a first end, and electrical interconnects on a backplane connector on a second end. The flex circuit(s) include an electrical cable, such as a ribbon cable, that includes a polymer or other material surrounding electrical wires to allow the flex circuit and its internal supported electrical wires to bend and flex, and thus move relative to backplane. Thus, when a blade computer system is installed in a chassis slot, and a blade backplane interconnect is connected to the backplane interconnect in a rigid connection, the backplane interconnect connected to the backplane through the flex circuit(s) can move relative to displacement in the backplane. The electrical connection integrity between the backplane interconnect and a connected blade backplane interconnect of a blade computer system is maintained and not as susceptible to breakage and failure due to displacement of the backplane. In other aspects, the backplane interconnect and the blade backplane interconnect of a blade computer system include registration feature. These registration features are configured to engage with each other to assist in their alignment and electrical connection when a blade computer system is installed in a chassis slot of an equipment rack and moved towards the backplane to engage its blade backplane interconnect to the backplane interconnect of the backplane aligned with the chassis slot. The blade backplane interconnect could also be provided a floating interconnect to allow the blade backplane interconnect to float relative to the circuit board(s) in the blade computer system.

Before discussing examples of backplane interconnect systems that include floating backplane interconnects coupled to a backplane for connecting blade computer systems to the backplane, wherein the floating backplane interconnects are configured to provide a floating connection with a backplane starting at FIG. 3, an exemplary backplane interconnect system that does not include floating backplane interconnects is first described below with regard to FIGS. 2A-2C.

Figure 1B:
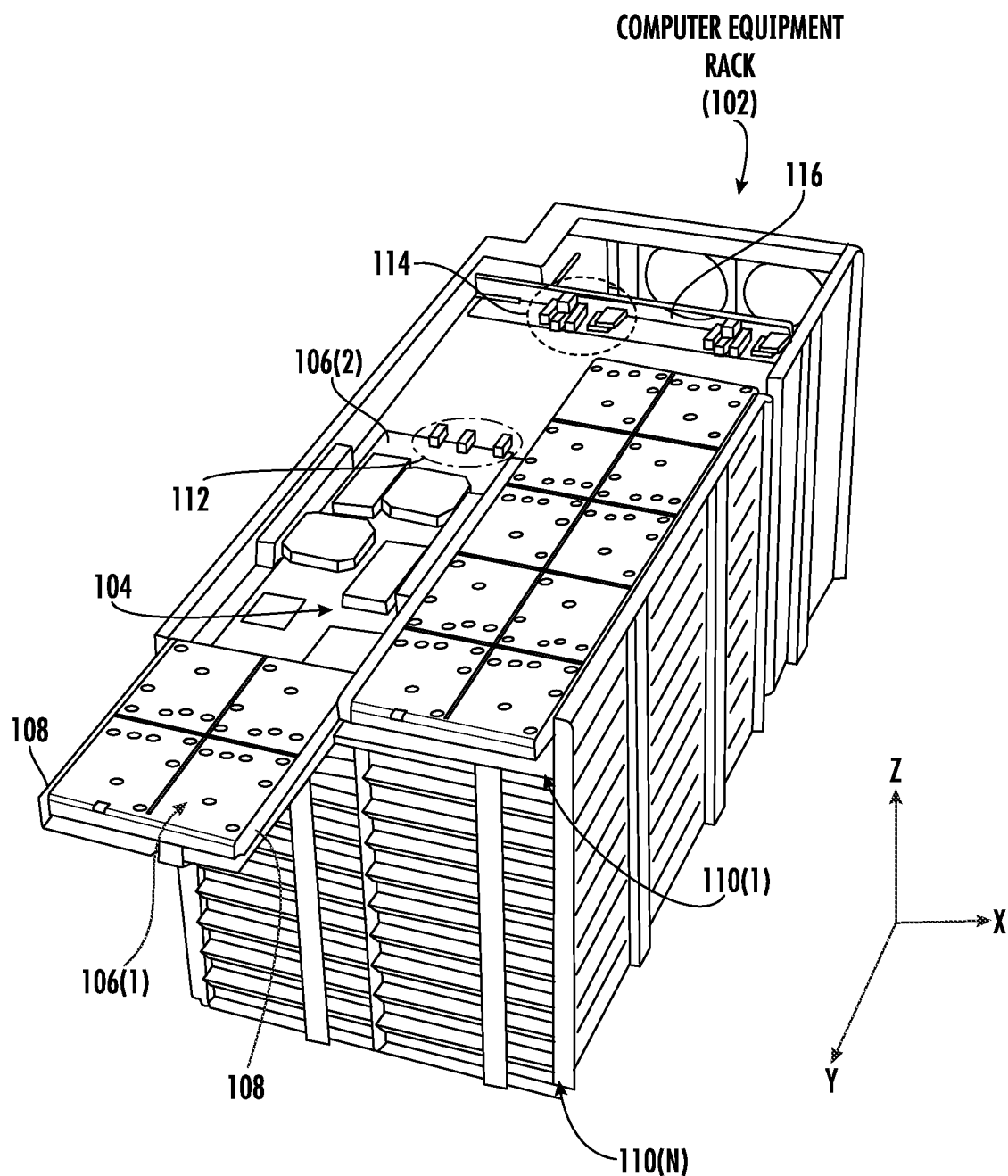
FIG. 1B is a more detailed diagram of a blade computer system installed in a computer equipment rack in FIG. 1A, wherein the blade computer system is interfaced to backplane.
Figure 2A:
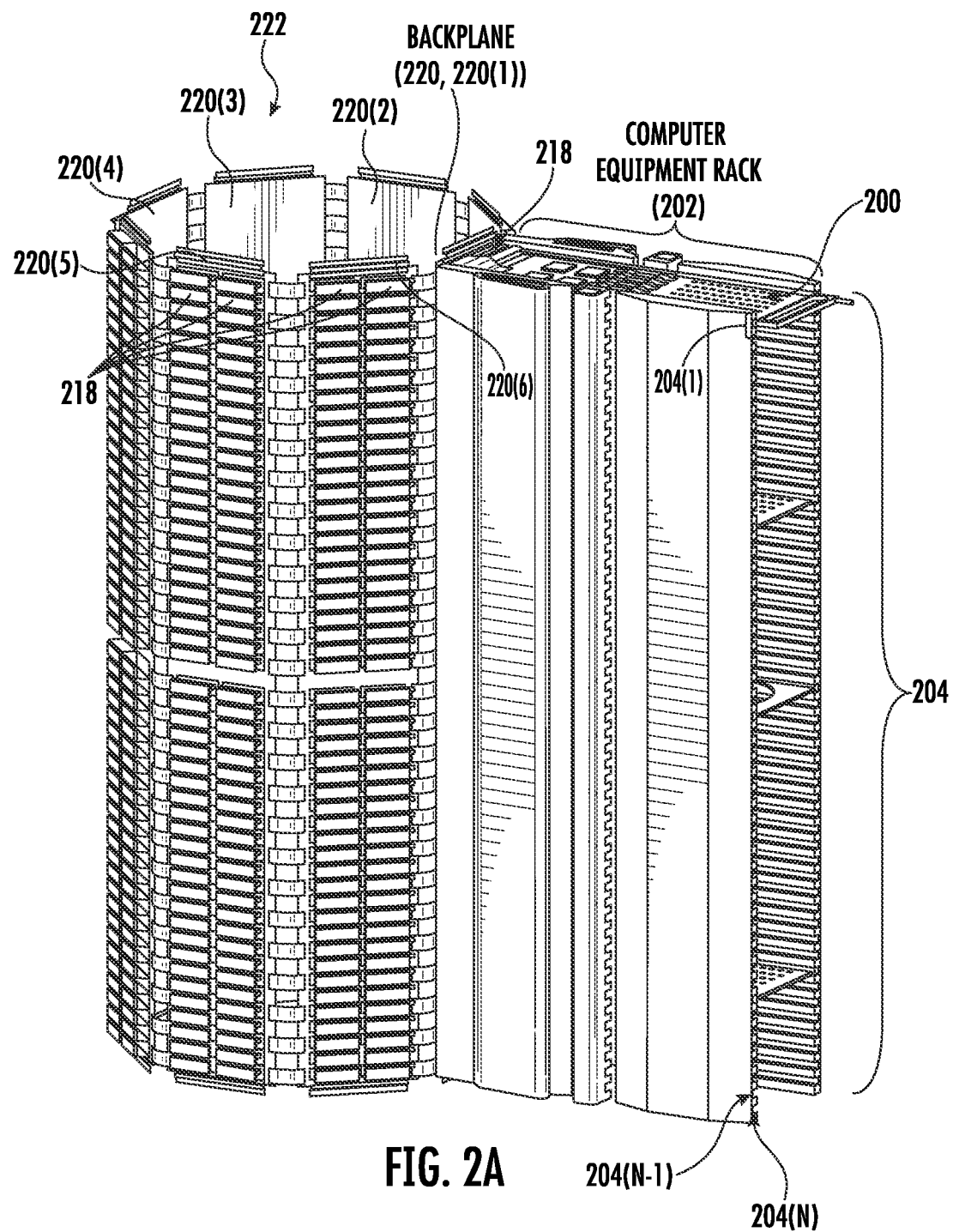
FIG. 2A illustrates an exemplary computer equipment tower that includes a plurality of computer equipment racks that each include a plurality of chassis slots each aligned with a backplane interconnect in a backplane for interconnecting a blade computer system to the backplane.

In this regard, FIG. 2A illustrates blade computer systems 200 that are configured to be supported in a computer equipment rack 202. Note that only one computer equipment rack 202 is shown, but this example allows for additional computer equipment racks 202 to support other blade computer systems 200. The computer equipment rack 202 that includes a plurality of chassis slots 204(1)-204(N) in an array each configured to receive and support an installed blade computer system 200. For example, FIG. 2A shows a blade computer system 200 installed in the chassis slot 204(1) of the computer equipment rack 202. As shown in FIG. 2B, the blade computer system 200 includes an enclosure 206 that support one or more PCBs 208(1), 208(2) each mounted with one or more integrated circuit (IC) chips 210 and/or other electronic devices 212. The enclosure 206 of the blade computer system 200 includes external slots 214(2), 214(2) that are configured to be engaged with a complementary rails in a chassis slot 204 in the computer equipment rack 202 in FIG. 2A to support the blade computer system 200. The enclosure 206 can also serve as a heat spreader to dissipate heat. FIG. 2C illustrates a plurality of blade computer systems 200(1)-200(N) in a stacked arrangement as they would be oriented when installed in respective chassis slots 204(1)-204(N) in a computer equipment rack 202. As shown in FIG. 2C, each blade computer system 200(1)-200(N) includes a respective backplane connector(s) 216(1)-216(N) that includes wires or electrical traces interconnected to electrical devices mounted on their respective PCBs 208(1), 208(2). The backplane connector(s) 216 of the blade computer system 200 allows the blade computer system 200 to be interconnected (i.e., networked) to other systems.

Figure 2B:
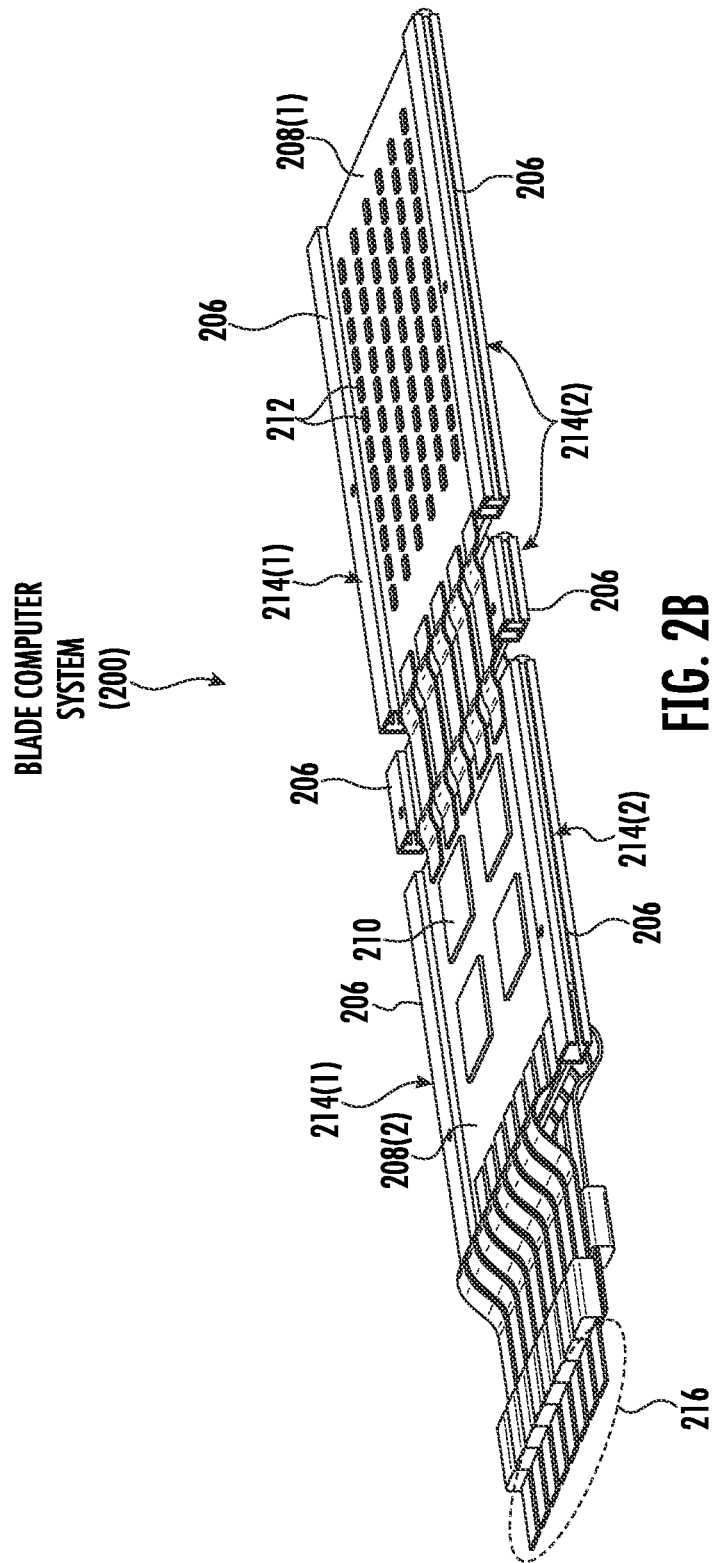
FIG. 2B illustrates a blade computer system in FIG. 2A.

In this regard, as shown in FIGS. 2A and 2B, when enclosure 206 of the blade computer system 200 is fully inserted into a chassis slot 204(1) as an example, the backplane connector(s) 216 of the blade computer system 200 engages with a complementary backplane connector(s) 218 on a backplane 220. This establishes a networked connection with the blade computer system 200 through an electrical interconnection between the backplane connector(s) 218 of a backplane 220 and the backplane connector(s) 216 of a respective blade computer system 200. The backplane 220 can be configured to provide interconnections between different backplane connector(s) 218 at different levels to provide between different blade computer systems 200 installed in the same computer equipment rack 202. It may also be desired to network a particular blade computer system 200 in one computer equipment rack 202 with another blade computer system 200 in another computer equipment rack. In this regard, as shown in FIG. 2A, a series of backplanes 220(1)-220(6) may be arranged adjacent to each other as shown in FIG. 2A to form a computer equipment tower 222 for supporting a larger number of networked blade computer systems 200. Interconnections between different blade computer systems 200 installed in different computer equipment racks 202 can be supported between interconnections between backplanes 220(1)-220(6).

Figure 2C:
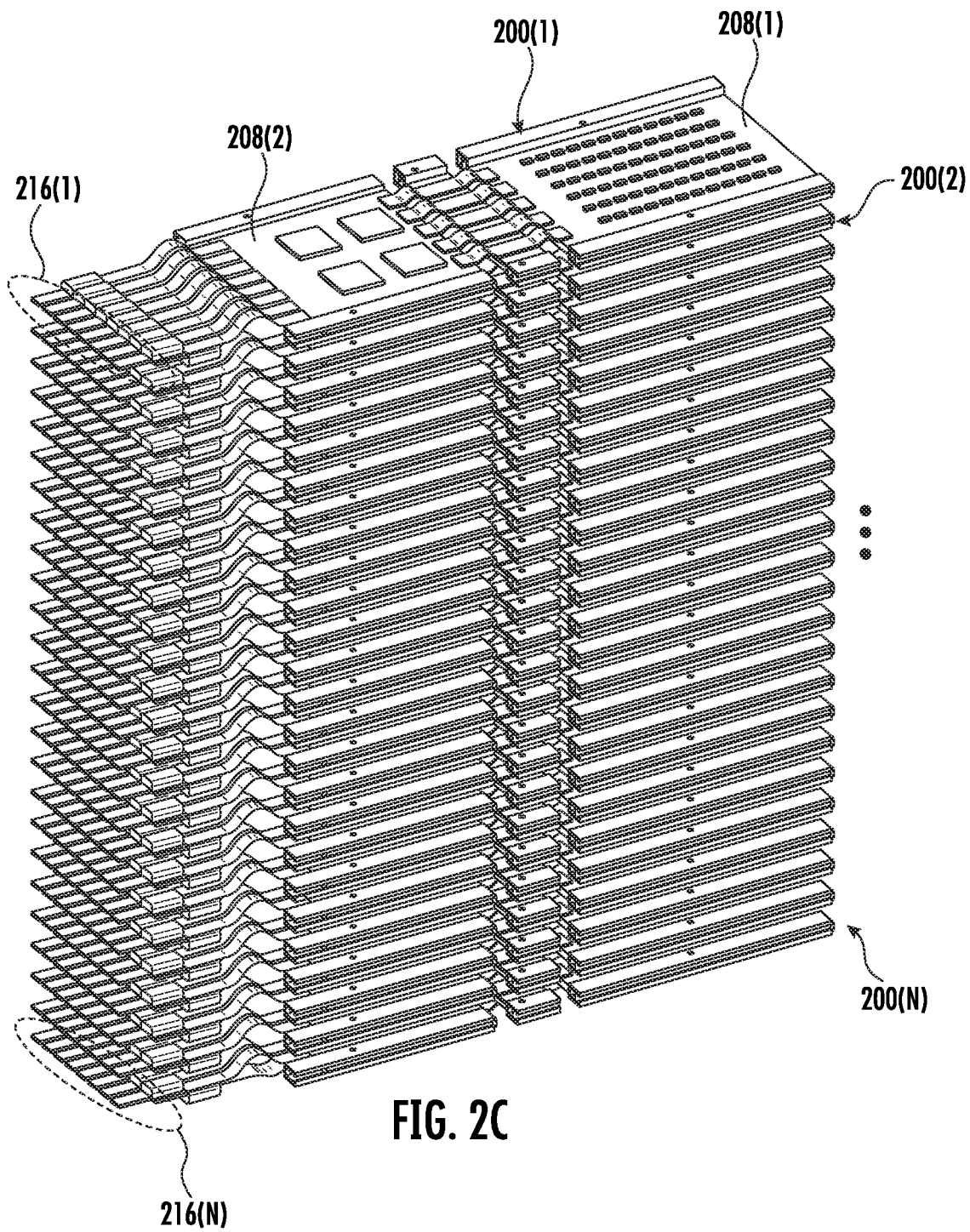
FIG. 2C illustrates a plurality of blade computer systems in FIG. 2A in a stacked arrangement as they would be supported when installed in respective adjacent chassis slots in a computer equipment rack in the computer equipment tower in FIG. 2A.

With continuing reference to FIGS. 2A-2C, note that the coefficient of thermal expansion (CTE) may be different between, for example, the backplane connector(s) 216, the PCBs 208(1), 208(2), and the interconnections between the PCB 208(1), 208(2) of the blade computer system 200. This can cause these different components to expand and contract differently with respect to each other at a given temperature. This in turn can cause stress to be imparted between the interconnections between these components, and between the backplane connector(s) 216 and a connected backplane 220. Further, the temperatures experienced by different sections of the blade computer system 200 may also be different. For example, if the blade computer system 200 is employed in a supercomputing environment, the backplane connector(s) 216, and the PCB 208(1) may experience much lower temperatures (e.g., 4 Kelvin) than the PCB 208(2) (e.g., 77 Kelvin). The PCB 208(1) may be designed to be on a "cold side" of the blade computer system 200 that is configured to perform supercomputing tasks. On the other hand, the PCB 208(2) of the blade computer system 200 may be designed to be on a "warm side" of the blade computer system 200. These differences in experienced temperatures as well as these components having different CTEs can cause these components to expand and contract differently thus imparting stress on their interconnections including the backplane connector(s) 216. For example, the backplane connector(s) 216 may be tightly aligned with complementary backplane connectors 218 on the backplane 220 with very low tolerance for displacement, especially if the backplane connector(s) 216 are high density connectors for higher density connections.

FIG. 3 is a perspective, side view an exemplary backplane interconnect system 300 that includes backplane 302 that includes a plurality of floating backplane interconnects 304(1)-304(B) to allow the floating backplane interconnects 304(1)-304(B) to float or move relative to a displacement of the backplane 302. As discussed in more detail below, the floating backplane interconnects 304(1)-304(B) for the backplane 302 are each configured to be interconnected to a blade backplane interconnect 306(1)-306(B) of a respective blade computer system 308(1)-308(B) to establish an interconnection between the blade computer system 308(1)-308(B) and the backplane 302. The backplane 302 is a circuit board or other structure that contains internal writing in the form of traces to routing electrical signals between the floating backplane interconnects 304(1)-304(B) for networking blade computer systems 308(1)-308(B) in this example. The internal writing in the backplane 302 may also be routed to another backplane or other system. The blade computer systems 308(1)-308(B) are provided in the form of one or more circuit boards (e.g., printed circuit boards (PCBs)) that are supported in a chassis configured to be installed in a chassis slot in an equipment rack aligned to the backplane interconnects. Using the blade computer system 308(1) as an example, the blade computer system 308(1) includes circuit boards 310(1), 310(2) (e.g., PCBs) that are supported in a chassis 312 that is configured to be installed in a chassis slot in an equipment rack such that the blade backplane interconnect 306(1) is generally aligned with a complementary backplane interconnect 306(1) of the backplane 302. The chassis 312 can also serve as a heat spreader to dissipate heat.

As discussed in more detail below, the floating backplane interconnects 304(1)-304(B) are each configured to float relative to displacement of the backplane 302 to avoid stress and damage that may be imparted on the floating backplane interconnects 304(1)-304(B) when connected to a respective blade computer system 308(1)-308(B) due to displacement of the backplane 302. For example, the backplane 302 may expand and contract in the vertical, Z-axis direction relative to the blade computer systems 308(1)-308(B). The backplane 302 may have a different CTE than the components of floating backplane interconnects 304(1)-304(B). The CTE of the floating backplane interconnects 304(1)-304(B) may be different than the CTE of the components of the blade backplane interconnects 306(1)-306(B). Further yet, the CTE of the components of the blade backplane interconnects 306(1)-306(B) may be different that the CTE of the circuit board 310(1) to which the blade backplane interconnects 306(1)-306(B) are connected. Thus, when these components possibly have different CTEs, these components will expand or contract differently for a given temperature. Further, even if the CTEs between these components were the same, these different components may experience different temperatures depending on the design of the backplane interconnect system 300 and its environment. For example, the backplane interconnect system 300 may be used in a supercomputing, cold environment for performance reasons where the temperature of the backplane 302 is maintained at a much lower temperature (e.g., 4 Kelvin) than the temperature of the blade backplane interconnects 306(1)-306(B) and circuit boards 310(1) of the blade computer systems 308(1)-308(B) (e.g., 77 Kelvin). Even further, the temperature of circuit boards 310(2) of the blade computer systems 308(1)-308(B) may be kept at a higher temperature (e.g., 273 Kelvin).

With continuing reference to FIG. 3, in this example, to allow the floating backplane interconnects 304(1)-304(B) to float relative to the backplane 302, the floating backplane interconnects 304(1)-304(B) each include one or more flex circuits 314 as shown for the floating backplane interconnect 304(1). In this example, the floating backplane interconnect 304(1) has two (2) flex circuits 314(1), 314(2). As shown in close-up view of the floating backplane interconnect 304(1) in FIG. 4, the flex circuits 314(1), 314(2) each include a flexible electrical cable 316(1), 316(2) having a first end 318 and a second end 320. The flexible electrical cable 316(1), 316(2) each include a plurality of electrical wires 322(1), 322(2) extending from the first end 318 to the second end 320. The flexible electrical cables 316(1), 316(2) may be made from a polymer material that can support and insulate the electrical wires 322(1), 322(2) and bend flexibly. This allows the floating backplane interconnect 304(1) to move relative to the backplane 302 without damaging the electrical connection between the flex circuits 314(1), 314(2) and the backplane 302. The electrical wires 322(1), 322(2) are exposed adjacent to the first end 318 of the flexible electrical cables 316(1), 316(2) and configured to be placed in electrical contact with a respective backplane electrical conductor 324(1), 324(2) among a plurality of backplane electrical conductors 324(1), 324(2) in the backplane 302. For example, the backplane electrical conductors 324(1), 324(2) may be exposed pads or other electrical structures that are configured to be aligned and electrically connect with complementary electrical conductors exposed from the flexible electrical cables 316(1), 316(2) and electrically coupled to respective electrical wires 322(1), 322(2) in the flexible electrical cables 316(1), 316(2). The electrical wires 322(1), 322(2) are exposed adjacent to the second end 320 of the flexible electrical cables 316(1), 316(2) and configured to be placed in electrical contact with backplane connector electrical conductors 325(1), 325(2) in respective backplane connectors 326(1), 326(2) of floating backplane interconnect 304(1), as shown in FIGS. 3 and 4, and particularly in FIG. 5B. The floating backplane interconnect 304(1) can then be electrically connected to a blade backplane interconnect 306(1) of the blade computer system 308(1) as shown in FIGS. 3 and 4 to establish an electrical connection between blade computer system 308(1) and the backplane 302 through the blade backplane interconnect 306(1) and the floating backplane interconnect 304(1). FIG. 4 also shows the blade backplane interconnect 306(2) of the blade computer system 308(2) fully engaged with and connected to its complementary floating backplane interconnect 304(2).

With reference to FIGS. 3 and 4, the flexible electrical cables 316(1), 316(2) of the flex circuits 314(1), 314(2) of the floating backplane interconnect 304(1) are configured to bend relative to the backplane 302 and the floating backplane interconnects 304(1)-304(B). This allows a rigid connection between the blade backplane interconnects 306(1)-306(B) and their complementary floating backplane interconnects 304(1)-304(B) to avoid damage or be less susceptible to breakage of connections due to displacement or movement of the backplane 302 relative to the floating backplane interconnects 304(1)-304(B). More exemplary detail of the floating backplane interconnects 304(1)-304(B) and the blade backplane interconnects 306(1)-306(B) will be discussed.

FIGS. 4 and 5A-5D illustrate additional views of the backplane 302, the floating backplane interconnects 304(1), 304(2) and a complementary blade backplane interconnects 306(1), 306(2). With reference to FIGS. 4 and 5A-5D, and using the floating backplane interconnect 304(1) as an example, the floating backplane interconnect 304(1) includes a backplane backers 328(1), 328(2). The backplane backers 328(1), 328(2) support their respective backplane connectors 326(1), 326(2). The backplane backers 328(1), 328(2) also support registration structures, as discussed below, for aligning the floating backplane interconnect 304 (1) with its complementary blade backplane interconnect 306(1). The backplane backers 328(1), 328(2) may be structures that are made of a metal material, such as Aluminum for example, to provide support and structure while at the same time being lighter in weight since they are supported by their respective flexible electrical cables 316(1), 316(2) of the respective flex circuits 314(1), 314(2). The backplane backers 328(1), 328(2) may also be made of a ceramic material, as another example. It may also be desired to use a material(s) for the backplane backers 328(1), 328(2) that has a low heat capacity so that backplane backers 328(1), 328(2) can be cooled down faster in a supercomputing environment for example. The backplane backers 328(1), 328(2) each include a planar surface 330(1), 330(2) as shown in FIGS. 4 and 5A. The planar surface 330(1), 330(2) are configured to support respective the backplane connectors 326(1), 326(2) that contain backplane connector electrical conductors 325(1), 325(2). As shown in FIGS. 4-5B, the backplane backers 328(1), 328(2) may include optional intermediate structures 332(1), 332(2) that are attached to the respective planar surfaces 330(1), 330(2) of the backplane backers 328(1), 328(2), wherein the intermediate structures 332(1), 332(2) directly support the backplane connectors 326(1), 326(2). As shown in FIGS. 5A and 5B, the backplane electrical connectors 326(1), 326(2) may include circuit boards 334(1), 334(2) in which the backplane connector electrical conductors 325(1), 325(2) are exposed for making electrical connections to the complementary blade backplane interconnect 306(1). The circuit boards 334(1), 334(2) may be made from a polymer material, such as FR4 for example. As shown in FIG. 5B, the circuit board 334(1) may include a backer surface 336(1) disposed on the backplane backer 328(1) and a front surface 338(1). The backplane connector electrical conductors 325(1) are exposed through the front surface 338(1) of the circuit board 334(1).

As shown in FIG. 4, flexible electrical cables 316(1), 316(2) of the flex circuits 314(1), 314(2) are shaped and biased such that the backplane backers 328(1), 328(2) are located at a standoff distance $D_1$ from the backplane 302 in their natural unconnected state when no lateral force is applied to the backplane backers 328(1), 328(2). The flexible electrical cables 316(1), 316(2) of the flex circuits 314(1), 314(2) are also shaped in an S-shape in this example as shown in FIG. 4. The flexible electrical cables 316(1), 316(2) include a convex section $C_1$ of radius $R_1$ adjacent to the backplane 302 and first end 318 between the first end 318 and the second end 320 of the flexible electrical cables 316(1), 316(2). The flexible electrical cables 316(1), 316(2) also include a concave section $C_2$ of radius $R_2$ adjacent to the backplane 302 and first end 318 between the first end 318 and the second end 320 of the flexible electrical cables 316(1), 316(2). Biasing the flexible electrical cables 316(1), 316(2) in this S-shape with the convex and concave sections $C_1$, $C_2$ provides a natural elasticity and resilience in the flexible electrical cables 316(1), 316(2) to push the backplane backer 328(1), 328(2) out when a force applied by a respective blade computer system 308(1) towards the backplane 302 is released when the blade computer system 308(1) is unconnected. Biasing the flexible electrical cables 316(1), 316(2) in this S-shape which also provides a natural elasticity and resilience in the flexible electrical cables 316(1), 316(2) to support the backplane backers 328(1), 328(2) outward away from the backplane 302 to provide a resistance that more easily allows a complementary registration feature in the blade backplane interconnect 306(1) discussed below.

Also, in this example, the floating backplane interconnects 304(1)-304(B) are include registration features that are configured to mate with complementary registration features in a complementary blade backplane interconnect 306(1)-306(B). These registration features assist to align the floating backplane interconnects 304(1)-304(B) and respective blade backplane interconnect 306(1)-306(B) when connecting a respective blade computer system 308(1)-308(B) to the backplane 302.

In this regard, as shown in FIGS. 5B and 5D, using the floating backplane interconnect 304(1) as an example, the registration structures in the form of pins 340(1), 340(2) are included in the backplane backer 328(1). The pins 340(1), 340(2) are configured to be received by orifices 342(1), 342(2) in the blade backplane interconnect 306(1) to align the backplane backer 328(1) and thus the floating backplane interconnects 304(1) with the blade backplane interconnect 306(1) when connected. Further, as shown in FIGS. 5A and 6, the floating backplane interconnect 304(1) also includes threaded orifices 344(1), 344(2) in the respective backplate backers 328(1), 328(2) that are configured to receive threaded screws 346(1), 346(2) extending from the blade backplane interconnect 306(1), as additional registration structures to further align the floating backplane interconnects 304(1) to the respective blade backplane interconnect 306(1). The threaded screws 346(1), 346(2) also engage with the threaded orifices 344(1), 344(2) to secure the floating backplane interconnects 304(1) to the respective blade backplane interconnect 306(1).

Note that the blade backplane interconnects 306(1)-306(B) in the blade computer systems 308(1)-308(B) in FIG. 3 can also be provided as floating backplane connectors similar to the floating backplane interconnects 304(1)-304(B). In this example, with reference to FIGS. 4, 5C and 5D, the blade backplane interconnect 306(1) has two (2) blade flex circuits 364(1), 364(2). As shown in close-up view of the blade backplane interconnect 306(1) in FIG. 4, the blade flex circuits 364(1), 364(2) each include a blade flexible electrical cable 366(1), 366(2) having a first end 368 and a second end 370. The blade flexible electrical cable 366(1), 366(2) each include a plurality of blade electrical wires 372(1), 372(2) extending from the first end 368 to the second end 370. As shown in FIGS. 4, 5C, and 5D, the blade flexible electrical cables 366(1), 366(2) may be made from a polymer material that can support and insulate the blade electrical wires 372(1), 372(2) and bend flexibly to allow the blade backplane interconnect 306(1) to move relative to the backplane 302 without damaging the electrical connection between the blade flex circuits 364(1), 364(2) and the blade backplane interconnect 306(1). The blade electrical wires 372(1), 372(2) are exposed adjacent to the second end 370 of the blade flexible electrical cables 366(1), 366(2) and configured to be placed in electrical contact with the circuit board 310(1). The blade electrical wires 372(1), 372(2) are exposed adjacent to the first end 368 of the blade flexible electrical cables 366(1), 366(2) and configured to be placed in electrical contact with blade backplane connector electrical conductors 375(1), 375(2) in respective blade backplane connectors 376(1), 376(2) of blade backplane interconnect 306(1). The blade backplane interconnect 306(1) can then be electrically connected to the floating backplane interconnect 304(1) to establish an electrical connection between blade computer system 308(1) and the backplane 302.

With reference to FIGS. 4 and 5C, the blade flexible electrical cables 366(1), 366(2) of the blade flex circuits 364(1), 364(2) are configured to bend. This allows a rigid connection between the blade backplane interconnects 306(1)-306(B) and their complementary floating backplane interconnects 304(1)-304(B) to not be damaged or susceptible to issues due to displacement or movement of the backplane 302 relative to the blade backplane interconnects 306(1)-306(B).

With reference to FIGS. 5C and 5D, and using the blade backplane interconnect 306(1) as an example, the blade backplane interconnect 306(1) includes blade backplane backers 378(1), 378(2). The blade backplane backers 378 (1), 378(2) support their respective blade backplane connectors 376(1), 376(2). The blade backplane backers 378(1), 378(2) may be structures that are made of a metal material, such as Aluminum, to provide support and structure while at the same time being lighter in weight since they are supported by respective blade flexible electrical cables 366(1), 366(2) of the respective blade flex circuits 364(1), 364(2). The blade backplane backers 378(1), 378(2) each include a blade planar surface 380(1), 380(2) as shown in FIG. 5C. The blade planar surfaces 380(1), 380(2) are configured to support respective blade backplane connectors 376(1), 376 (2) that contain blade backplane connector electrical conductors 375(1), 375(2). As shown in FIGS. 5C and 5D, the blade backplane backers 378(1), 378(2) may include optional blade intermediate structures 382(1), 382(2) that are attached to the respective blade planar surfaces 380(1), 380(2) of the blade backplane backers 378(1), 378(2), wherein the blade intermediate structures 382(1), 382(2) directly support the blade backplane connectors 376(1), 376(2). As shown in FIGS. 5C and 5D, the blade backplane connectors 376(1), 376(2) may include blade circuit boards 384(1), 384(2) in which the blade backplane connector electrical conductors 375(1), 375(2) are exposed for making electrical connections to the complementary blade backplane interconnect 306(1). The blade circuit boards 384(1), 384(2) may be made from a polymer material, such as FR4 for example. As shown in FIG. 5C, the blade backplane connector electrical conductors 375(1), 375(2) are exposed through the blade circuit boards 384(1), 384(2).

As shown in FIG. 4, the blade flexible electrical cables 366(1), 366(2) of the flex circuits 314(1), 314(2) are S-shaped and biased. The blade flexible electrical cables 366(1), 366(2) of the blade flex circuits 364(1), 364(2) are also shaped in an S-shape in this example as shown in FIG. 4. The blade flexible electrical cables 366(1), 366(2) include a convex section $C_3$ of radius $R_3$ between a first end 368 and a second end 370 of the blade flexible electrical cables 366(1), 366(2). The blade flexible electrical cables 366(1), 366(2) also include a concave section $C_4$ adjacent to the second end 370, between the first end 368 and the second end 370 of the blade flexible electrical cables 366(1), 366(2). Biasing the blade flexible electrical cables 366(1), 366(2) in this S-shape with the convex and concave sections $C_3$, $C_4$ provides a natural elasticity and resilience in the blade flexible electrical cables 366(1), 366(2).

Also, in this example, the floating backplane interconnects 304(1)-304(B) include registration features that are configured to mate with complementary registration features in a complementary blade backplane interconnect 306(1)-306(B). These registration features assist to align the floating backplane interconnects 304(1)-304(B) and respective blade backplane interconnect 306(1)-306(B) when connecting a respective blade computer system 308(1)-308(B) to the backplane 302.

In this regard, as shown in FIGS. 5B and 5D, using the floating backplane interconnect 304(1) as an example, the registration structures in the form of pins 340(1), 340(2) are included in the backplane backer 328(1). The pins 340(1), 340(2) are configured to be received by orifices 342(1), 342(2) in the blade backplane interconnect 306(1) to align the backplane backer 328(1) and thus the floating backplane interconnects 304(1) with the blade backplane interconnect 306(1) when connected. Further, as shown in FIGS. 5A and 6, the floating backplane interconnect 304(1) also includes threaded orifices 344(1), 344(2) in the respective backplate backers 328(1), 328(2) that are configured to receive threaded screws 346(1), 346(2) extending from the blade backplane interconnect 306(1), as additional registration structures to further align the floating backplane interconnects 304(1) to the respective blade backplane interconnect 306(1). The threaded screws 346(1), 346(2) also engage with the threaded orifices 344(1), 344(2) to secure the floating backplane interconnects 304(1) to the respective blade backplane interconnect 306(1).

FIG. 7 illustrates a computer system 700 that can employ and support the networking of the blade computer systems 308(1)-308(B) through backplanes and the floating backplane interconnects 304(1)-304(B). In this regard, the computer system 700 shown in FIG. 7 illustrates a computer equipment rack 702 that includes a plurality of chassis slots 704(1)-704(M) in an array each configured to receive and support respective, installed blade computer systems 308(1)-308(B). FIG. 7 shows a blade computer system 308(1) installed in the chassis slot 704(1) of the computer equipment rack 702. When the blade computer system 308(1) is fully inserted into the chassis slot 704(1) as an example, the blade backplane interconnect 306(1) of the blade computer system 308(1) engages with a complementary floating backplane interconnect 304(1) to establish an electrical connection to a backplane 720(1). Note that FIG. 7 is shown with multiple backplanes 720(2)-720(7) that are like the backplane 720(1), wherein each backplane 720(2)-720(7) can also support a respective computer equipment rack 702. Also note that backplanes that would normally be adjacent to backplane 720(6) and 720(7) are removed for illustrative purposes only.

FIG. 8 is a block diagram of an exemplary processor-based system 800 that can be included in a blade computer system including the blade computer systems 308(1)-308(B) in FIGS. 3-7. In this example, the processor 802 that includes one or more CPU cores 804(1)-804(P). The processor-based system 800 may be a circuit or circuits included in an electronic board card, such as, a printed circuit board (PCB), a server, a personal computer, a desktop computer, a laptop computer, a personal digital assistant (PDA), a computing pad, a mobile device, or any other device, and may represent, for example, a server or a user's computer. The processor 802 represents one or more general-purpose processing circuits, such as a microprocessor, central processing unit, or the like. The processor 802 is configured to execute processing logic in computer instructions for performing the operations and steps discussed herein. The processor 802 also includes an instruction cache 808 for temporary, fast access memory storage of instructions. Fetched or prefetched instructions from a memory, such as from a system memory 810 over a system bus 812, are stored in the instruction cache 808.

The processor 802 and the system memory 810 are coupled to the system bus 812 and can intercouple peripheral devices included in the processor-based system 800. As is well known, the processor 802 communicates with these other devices by exchanging address, control, and data information over the system bus 812. For example, the processor 802 can communicate bus transaction requests to a memory controller 814 in the system memory 810 as an example of a slave device. Although not illustrated in FIG. 8, multiple system buses 812 could be provided, wherein each system bus constitutes a different fabric. In this example, the memory controller 814 is configured to provide memory access requests to a memory array 816 in the system memory 810. The memory array 816 is comprised of an array of storage bit cells for storing data. The system memory 810 may be a read-only memory (ROM), flash memory, dynamic random access memory (DRAM), such as synchronous DRAM (SDRAM), etc., and a static memory (e.g., flash memory, static random access memory (SRAM), etc.), as non-limiting examples.

Other devices can be connected to the system bus 812. As illustrated in FIG. 8, these devices can include the system memory 810, one or more input device(s) 818, one or more output device(s) 820, a modem 822, and one or more display controllers 824, as examples. The input device(s) 818 can include any type of input device, including but not limited to input keys, switches, voice processors, etc. The output device(s) 820 can include any type of output device, including but not limited to audio, video, other visual indicators, etc. The modem 822 can be any device configured to allow exchange of data to and from a network 826. The network 826 can be any type of network, including but not limited to a wired or wireless network, a private or public network, a local area network (LAN), a wireless local area network (WLAN), a wide area network (WAN), a BLUETOOTH™ network, and the Internet. The modem 822 can be configured to support any type of communications protocol desired. The processor 802 may also be configured to access the display controller(s) 824 over the system bus 812 to control information sent to one or more displays 828. The display(s) 828 can include any type of display, including but not limited to a cathode ray tube (CRT), a liquid crystal display (LCD), a plasma display, etc.

The processor-based system 800 in FIG. 8 may include a set of instructions 830 to be executed. The instructions 830 may be stored in the system memory 810, processor 802, and/or instruction cache 808 as examples of non-transitory computer-readable medium 832. The instructions 830 may also reside, completely or at least partially, within the system memory 810 and/or within the processor 802 during their execution. The instructions 830 may further be transmitted or received over the network 826 via the modem 822, such that the network 826 includes the non-transitory computer-readable medium 832.

While the non-transitory computer-readable medium 832 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory (RAM), a magnetic disk storage medium, an optical storage medium, flash memory devices, etc.) and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories, registers, or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium, and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be referenced throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. A computer system, comprising: a backplane comprising a plurality of backplane electrical conductors; and a plurality of floating backplane interconnects each comprising: a backplane backer comprising a planar surface; a backplane connector disposed on the planar surface, the backplane connector comprising a plurality of backplane connector electrical conductors; and a flex circuit comprising a flexible electrical cable having a first end and a second end and comprising a plurality of electrical wires extending between the first end to the second end, wherein: electrical wires adjacent to the first end of the flexible electrical cable are each in electrical contact with a respective backplane electrical conductor among the plurality of backplane electrical conductors; the electrical wires are adjacent to the second end of the flexible electrical cable are in electrical contact with a respective backplane connector electrical conductor among the plurality of backplane connector electrical conductors for a respective blade computer system among a plurality of blade computer systems; wherein the flex circuit of each floating backplane interconnect among the plurality of floating backplane interconnects is configured to bend relative to the backplane; and wherein the flex circuit of each floating backplane interconnect among the plurality of floating backplane interconnects is configured to bend relative to vertical displacement of the backplane in a Z-axis direction.

2. The computer system of claim 1, wherein the flex circuit supports the backplane backer at a standoff distance from the backplane when no lateral force is applied to the planar surface of the backplane backer.

3. The computer system of claim 1, wherein the flex circuit is configured to bend relative to the backplane when a force is applied to the backplane backer.

4. The computer system of claim 1, wherein each of the plurality of the backplane connector electrical conductors of the backplane connector of at least one floating backplane interconnect is configured to be electrically coupled to respective blade backplane connector electrical conductors of a blade backplane interconnect of a blade computer system to electrically couple the blade computer system to the backplane connector.

5. The computer system of claim 4, wherein the backplane backer is further configured to be rigidly connected to the blade backplane interconnect of the blade computer system.

6. The computer system of claim 1, wherein for each flex circuit of a floating backplane interconnect among the plurality of floating backplane interconnects, the flexible electrical cable further comprises:
   a convex section of a first radius, the convex section adjacent to the backplane between the first end and the second end of the flexible electrical cable; and
   a concave section of a second radius, the concave section adjacent to the backplane connector between the first end and the second end of the flexible electrical cable.

7. The computer system of claim 1, further comprising:
a plurality of blade computer systems each comprising:
   a circuit board comprising a plurality of circuit board electrical conductors; and
   at least one floating blade backplane interconnect each comprising:
      a blade backplane backer comprising a planar surface;
      a blade backplane connector disposed on the planar surface, the blade backplane connector comprising a plurality of blade backplane connector electrical conductors; and
      a blade flex circuit comprising a blade flexible electrical cable having a first end and a second end and comprising a plurality of blade electrical wires extending from the first end to the second end, wherein:
      the blade electrical wires at the first end of the blade flexible electrical cable are in electrical contact with a respective blade backplane connector electrical conductor among the plurality of blade backplane connector electrical conductors in the blade backplane connector; and
      the blade electrical wires at the second end of the blade flexible electrical cable are in electrical contact with a respective circuit board electrical conductor among the plurality of circuit board electrical conductors on the circuit board.

8. The computer system of claim 7, wherein the blade flex circuit of each floating blade backplane interconnect among the at least one floating blade backplane interconnect is configured to bend relative to the circuit board.

9. The computer system of claim 1, wherein the flex circuit is configured to bend relative to a backplane when the first end of the electrical wires is placed in electrical contact with the respective backplane connector electrical conductor among the plurality of backplane connector electrical conductors in the backplane.

10. The computer system of claim 1, wherein the electrical wires adjacent to the second end of the flexible electrical cable are configured to be electrically coupled to respective blade backplane connector electrical conductors among a plurality of blade backplane connector electrical conductors of a blade backplane interconnect of a blade computer system to electrically couple the blade computer system to the backplane connector.

11. The computer system of claim 1, wherein the backplane connector comprises a circuit board comprising a backer surface disposed on the backplane backer and a front surface, wherein the plurality of backplane connector electrical conductors are exposed through the front surface.

12. The computer system of claim 1, further comprising at least one registration structure disposed on the planar surface adjacent to the backplane connector.

13. The computer system of claim 12, wherein the at least one registration structure is configured to be engaged with a complementary registration structure of a blade backplane interconnect of a blade computer system to align the backplane connector to a blade backplane connector.

14. The computer system of claim 12, wherein the at least one registration structure comprises at least one pin configured to be engaged with a respective at least one complementary orifice of a blade backplane interconnect of a blade computer system to align the backplane connector to the blade backplane interconnect.

15. The computer system of claim 12, wherein the at least one registration structure comprises at least one orifice configured to be engaged with a respective complementary pin of a blade backplane interconnect of a blade computer system to align the backplane connector to the blade backplane interconnect.

16. The computer system of claim 1, wherein the backplane backer comprises a second surface disposed on an opposite side of the planar surface, and the second surface comprises a curved end section.

17. A computer system, comprising: a backplane comprising a plurality of backplane electrical conductors; and a plurality of floating backplane interconnects each comprising: a backplane backer comprising a planar surface; a backplane connector disposed on the planar surface, the backplane connector comprising a plurality of backplane connector electrical conductors; and a flex circuit comprising a flexible electrical cable having a first end and a second end and comprising a plurality of electrical wires extending between the first end to the second end, wherein: electrical wires adjacent to the first end of the flexible electrical cable are each in electrical contact with a respective backplane electrical conductor among the plurality of backplane electrical conductors; and the electrical wires are adjacent to the second end of the flexible electrical cable are in electrical contact with a respective backplane connector electrical conductor among the plurality of backplane connector electrical conductors for a respective blade computer system among a plurality of blade computer systems; and the plurality of blade computer systems each comprising: a circuit board comprising a plurality of circuit board electrical conductors; and at least one floating blade backplane interconnect each comprising: a blade backplane backer comprising a planar surface; a blade backplane connector disposed on the planar surface, the blade backplane connector comprising a plurality of blade backplane connector electrical conductors; a blade flex circuit comprising a blade flexible electrical cable having a first end and a second end and comprising a plurality of blade electrical wires extending from the first end to the second end, wherein: the blade electrical wires at the first end of the blade flexible electrical cable are in electrical contact with a respective blade backplane connector electrical conductor among the plurality of blade backplane connector electrical conductors in the blade backplane connector; and the blade electrical wires at the second end of the blade flexible electrical cable are in electrical contact with a respective circuit board electrical conductor among the plurality of circuit board electrical conductors on the circuit board.

18. The computer system of claim 17, wherein the blade flex circuit of each floating blade backplane interconnect among the at least one floating blade backplane interconnect is configured to bend relative to the circuit board.

19. The computer system of claim 17, wherein the flex circuit is configured to bend relative to a backplane when the first end of the electrical wires is placed in electrical contact with a respective backplane connector electrical conductor among the plurality of backplane connector electrical conductors in the backplane.

20. The computer system of claim 17, wherein the electrical wires adjacent to the second end of the flexible electrical cable are configured to be electrically coupled to respective blade backplane connector electrical conductors among a plurality of blade backplane connector electrical conductors of a blade backplane interconnect of a blade computer system to electrically couple the blade computer system to the backplane connector.

21. The computer system of claim 17, wherein the backplane connector comprises a circuit board comprising a backer surface disposed on the backplane backer and a front surface, wherein the plurality of backplane connector electrical conductors are exposed through the front surface.

22. The computer system of claim 17, further comprising at least one registration structure disposed on the planar surface adjacent to the backplane connector.

23. The computer system of claim 17, wherein the backplane backer comprises a second surface disposed on an opposite side of the planar surface, and the second surface comprises a curved end section.

\* \* \* \* \*